US012467140B2

(12) United States Patent
Nandwana et al.

(10) Patent No.: US 12,467,140 B2
(45) Date of Patent: Nov. 11, 2025

(54) SHOWERHEAD ASSEMBLY AND COMPONENTS

(71) Applicant: ASM IP HOLDING B.V., Almere (NL)

(72) Inventors: Dinkar Nandwana, Tempe, AZ (US); Carl Louis White, Gilbert, AZ (US); Eric James Shero, Phoenix, AZ (US); William George Petro, Scottsdale, AZ (US); Herbert Terhorst, Amersfoort (NL); Gnyanesh Trivedi, Tempe, AZ (US); Mark Olstad, Chandler, AZ (US); Ankit Kimtee, Phoenix, AZ (US); Kyle Fondurulia, Phoenix, AZ (US); Michael Schmotzer, Chandler, AZ (US); Jereld Lee Winkler, Gilbert, AZ (US)

(73) Assignee: ASM IP Holding B.V., Versterkerstraat (NL)

( * ) Notice: Subject to any disclaimer, the term of this patent is extended or adjusted under 35 U.S.C. 154(b) by 366 days.

(21) Appl. No.: 17/149,023

(22) Filed: Jan. 14, 2021

(65) Prior Publication Data

US 2021/0214846 A1 Jul. 15, 2021

Related U.S. Application Data

(60) Provisional application No. 62/961,588, filed on Jan. 15, 2020.

(51) Int. Cl.
*C23C 16/40* (2006.01)
*C23C 16/455* (2006.01)
*C23C 16/458* (2006.01)

(52) U.S. Cl.
CPC .... *C23C 16/45565* (2013.01); *C23C 16/4583* (2013.01)

(58) Field of Classification Search
CPC .......... C23C 16/45565; C23C 16/4583; C23C 16/448; C23C 16/45548
USPC ........................ 118/715; 156/345.33, 345.34
See application file for complete search history.

(56) References Cited

U.S. PATENT DOCUMENTS 5,614,026 A * 3/1997 Williams .......... H01L 21/67017 427/575
5,643,394 A * 7/1997 Maydan ............ C23C 16/45576 118/723 R
6,942,753 B2 9/2005 Choi et al.
8,592,810 B2 11/2013 Ohmi et al.
9,975,320 B2 5/2018 Duan et al.
(Continued)

FOREIGN PATENT DOCUMENTS

JP 2018511695 4/2018
TW M410742 U 9/2011
(Continued)

*Primary Examiner* — Rudy Zervigon
(74) *Attorney, Agent, or Firm* — Snell & Wilmer L.L.P.

(57) ABSTRACT

The present disclosure pertains to embodiments of a showerhead assembly which can be used to deposit semiconductor layers using processes such as atomic layer deposition (ALD). The showerhead assembly has a showerhead which has an increased thickness which advantageously decreases reactor chamber size and decreases cycling time. Decreased cycling time can improve throughput and decrease costs.

20 Claims, 10 Drawing Sheets

(56) References Cited

U.S. PATENT DOCUMENTS

| | | | | |
|---|---|---|---|---|
| 2003/0209323 | A1* | 11/2003 | Yokogaki | C23C 16/45565 156/345.33 |
| 2005/0223986 | A1* | 10/2005 | Choi | C23C 16/45559 427/248.1 |
| 2005/0251990 | A1* | 11/2005 | Choi | C23C 16/45565 29/458 |
| 2006/0037698 | A1 | 2/2006 | Kennedy | |
| 2006/0086318 | A1 | 4/2006 | Matsubara et al. | |
| 2006/0228496 | A1* | 10/2006 | Choi | H01J 37/3244 118/715 |
| 2008/0020146 | A1* | 1/2008 | Choi | C23C 16/455 427/446 |
| 2008/0302303 | A1 | 12/2008 | Choi et al. | |
| 2016/0024656 | A1 | 1/2016 | White et al. | |
| 2021/0214846 | A1* | 7/2021 | Nandwana | C23C 16/4583 |

FOREIGN PATENT DOCUMENTS

| | | | |
|---|---|---|---|
| WO | 2011099205 | A1 | 8/2011 |
| WO | 2010079756 | A1 | 6/2012 |
| WO | 2019236937 | A1 | 12/2019 |

* cited by examiner

SHOWERHEAD ASSEMBLY AND COMPONENTS

CROSS-REFERENCE TO RELATED APPLICATIONS

This application claims priority to U.S. Provisional Patent Application No. 62/961,588, filed Jan. 15, 2020, the entire contents of which are incorporated by reference herein in their entirety and for all purposes.

BACKGROUND

Field

The present disclosure generally relates to a showerhead assembly for vapor phase reactors. More particularly, the disclosure relates to vapor distribution systems for vapor-phase reactors and to components of vapor distribution systems.

Description of the Related Art

Vapor-phase reactors, such as chemical vapor deposition (CVD), plasma-enhanced CVD (PECVD), atomic layer deposition (ALD), and the like can be used for a variety of applications, including depositing and etching materials on a substrate surface. For example, vapor-phase reactors can be used to deposit and/or etch layers on a substrate to form semiconductor devices, flat panel display devices, photovoltaic devices, microelectromechanical systems (MEMS), and the like.

A typical vapor-phase reactor system includes a reactor including a reaction chamber, one or more precursor vapor sources fluidly coupled to the reaction chamber, one or more carrier or purge gas sources fluidly coupled to the reaction chamber, a vapor distribution system to deliver gasses (e.g., the precursor vapor(s) and/or carrier or purge gas(ses)) to a surface of a substrate, and an exhaust source fluidly coupled to the reaction chamber. The system also typically includes a susceptor to hold a substrate in place during processing. The susceptor can be configured to move up and down to receive a substrate and/or can rotate during substrate processing.

The vapor distribution system may include a showerhead assembly for distributing vapor(s) to a surface of the substrate. The showerhead assembly is typically located above the substrate. During substrate processing, vapor(s) flow from the showerhead assembly in a downward direction toward the substrate and then radially outward over the substrate. A typical showerhead assembly includes a showerhead with a chamber adjacent to one surface of the showerhead and a plurality of apertures spanning between the chamber and a distribution surface (substrate side) of the showerhead. The apertures are generally cylindrical in shape, though other shapes are possible, and are spaced apart from each other, leaving a significant horizontal portion on both the chamber-side surface and the distribution surface of the showerhead.

SUMMARY

In one aspect a showerhead plate for distributing a vapor to a reaction chamber is provided, the showerhead plate including: a first surface; a second surface opposite to the first surface; and a plurality of apertures extending from the first surface to the second surface, where a thickness of the showerhead plate between the first and second surfaces is in a range of about 27 mm to about 33 mm.

In some embodiments, the thickness of the showerhead plate between the first and second surfaces is in a range of about 29 mm to about 31 mm. In some embodiments, a width of the showerhead plate is in a range of about 210 mm to about 260 mm. In some embodiments, a width of the showerhead plate is in a range of about 310 mm to about 360 mm. In some embodiments, a width of the showerhead plate is in a range of about 460 mm to about 500 mm. In some embodiments, the number of apertures in the plurality of apertures is in a range of about 1,500-4,500 apertures. In some embodiments, the number of apertures is in a range of about 1,500 to 2,500 apertures.

In some embodiments, at least one aperture of the plurality of apertures includes: a first axial inlet section extending from the first surface along a vertical axis of the showerhead plate; a first tapered section extending from the first axial inlet section, the first tapered section including an inwardly-angled sidewall that angles inwardly from the first axial inlet section; a conduit section extending from the first tapered section and oriented along the vertical axis of the showerhead plate, the conduit section having a smaller major lateral dimension than the first axial inlet section; and a second tapered section extending from the conduit section to the second surface, the second tapered section including an outlet configured to deliver the vapor to the reaction chamber.

In another aspect, a reactor assembly is provided which includes: a showerhead assembly including a showerhead plenum and the showerhead plate as previously discussed, the showerhead plenum disposed over the showerhead plate; a substrate support adapted to support a substrate; and a reaction chamber defined at least in part by the substrate support and the showerhead plate, where a height of the reaction chamber between a top surface of the substrate support to a bottom surface of the showerhead plate is in a range of 3 mm to 7 mm.

In some embodiments, the reactor assembly further includes a vaporizer configured to vaporize a solid source precursor.

In another aspect, a showerhead plate for distributing a vapor to a reaction chamber is provided, the showerhead plate including: a first surface; a second surface opposite to the first surface; a plurality of apertures extending from the first surface to the second surface, where multiple apertures of the plurality of apertures include: a first axial inlet section extending from the first surface along a vertical axis of the showerhead plate; a first tapered section extending from the first axial inlet section, the first tapered section including an inwardly-angled sidewall that angles inwardly from the first axial inlet section; a conduit section extending from the first tapered section and oriented along the vertical axis of the showerhead plate, the conduit section having a smaller major lateral dimension than the first axial inlet section; and a second tapered section extending from the conduit section to the second surface, the second tapered section comprising an outlet configured to deliver the vapor to the reaction chamber.

In some embodiments, a thickness of the showerhead plate between the first and second surfaces is in a range of about 27 mm to about 33 mm. In some embodiments, the thickness of the showerhead plate between the first and second surfaces is in a range of about 29 mm to about 31 mm. In some embodiments, the conduit section has a length in a range of about 15 mm to about 20 mm. In some embodiments, the first axial inlet section has a vertical height in a range of about 3.5 mm to about 4.5 mm. In some embodiments, the first tapered section has a vertical height in a range of about 3.5 mm to about 4.5 mm. In some embodiments, the second tapered section has a vertical height in a range of about 2.5 mm to about 3.5 mm.

In some embodiments, an angle of opposing sidewalls of the first tapered section is in a range of about 60° to about 90°. In some embodiments, an angle of opposing sidewalls of the second tapered section is in a range of about 60° to about 90°.

In another aspect, a reactor assembly is provided which includes: a showerhead assembly including a showerhead plenum and a showerhead plate including a plurality of apertures therethrough, the showerhead plenum disposed over the showerhead plate; a substrate support adapted to support a substrate; and a reaction chamber defined at least in part by the substrate support and the showerhead plate, wherein a height of the reaction chamber between a top surface of the substrate support to a bottom surface of the showerhead plate is in a range of 3 mm to 7 mm.

In some embodiments, the reactor assembly further includes a spacer that mechanically supports the showerhead plate. In some embodiments, the reaction chamber volume is in a range of about 1280-1920 $mm^2$. In some embodiments, the reaction chamber width is in a range about 200 mm to about 440 mm. In some embodiments, the ratio of reaction chamber height to reaction chamber width is in a range about 1:80 to 1:29. In some embodiments, the spacer has a thickness in a range of about 20 mm to 30 mm. In some embodiments, the reactor assembly further includes a vaporizer configured to vaporize a solid source precursor.

In another aspect, a showerhead plate for distributing a vapor to a reaction chamber is provided, the showerhead plate includes: a first surface; a second surface opposite to the first surface; a plurality of apertures extending from the first surface to the second surface, the plurality of apertures including: a plurality of outer apertures having aperture portions that extend along a vertical axis of the showerhead plate; and one or more inner apertures angled inwardly towards a central region of the showerhead plate.

In some embodiments, the outer apertures are disposed radially outside and at least partially surround the inner aperture(s). In some embodiments, the inner aperture(s) is angled inwardly by an angle in a range of 5° to 55° with respect to the vertical axis of the showerhead plate. In some embodiments, the inner aperture(s) include a first angled aperture located nearest the center position of the showerhead plate. In some embodiments, the inner aperture(s) further comprises a second angled aperture which is located at an opposite side of the center position of the showerhead plate from the first angled aperture. In some embodiments, the showerhead plate does not have an aperture at a center position of the showerhead plate. In some embodiments, a plate body portion of the showerhead plate is disposed at a center position of the showerhead plate.

In some embodiments, at least one aperture of the outer apertures includes: a first axial inlet section extending from the first surface along the vertical axis of the showerhead plate; a first tapered section extending from the first axial inlet section, the first tapered section comprising an inwardly-angled sidewall that angles inwardly from the first axial inlet section; a conduit section extending from the first tapered section and oriented along the vertical axis of the showerhead plate, the conduit section having a smaller major lateral dimension than the first axial inlet section; and a second tapered section extending from the conduit section to the second surface, the second tapered section comprising an outlet configured to deliver the vapor to the reaction chamber.

In another aspect, a reactor assembly is provided including: a reactor manifold having a bore; a showerhead assembly comprising a showerhead plenum and the showerhead plate previously disclosed, where the bore is laterally positioned at a center position of the showerhead plate; and a substrate support adapted to support a substrate.

In some embodiments, the substrate support is adapted to support the substrate at a location where the center position of the showerhead plate is aligned with a center position of the substrate.

In another aspect, a method of configuring a reactor assembly is provided, the method includes: providing a reactor assembly having a reaction chamber that includes a substrate support; selecting a showerhead plate having a thickness that provides a predetermined reaction chamber height, the reaction chamber height defined at least in part between a bottom surface of the showerhead plate and a top surface of the substrate support; and installing the showerhead plate in the reaction chamber over the substrate support to provide the predetermined reaction chamber height.

In some embodiments, the method further includes removing a second showerhead plate from the reactor assembly and retrofitting the reactor assembly with the showerhead plate. In some embodiments, the showerhead plate is thicker than the second showerhead plate. In some embodiments, selecting the showerhead plate includes selecting the showerhead plate from a plurality of showerhead plates to provide the predetermined reaction chamber height.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

In some semiconductor processing devices, reactant vapors flow from a plenum of a dispersion device (such as a showerhead assembly), through apertures of the dispersion assembly (e.g., apertures in the showerhead assembly, and towards a substrate (e.g., a semiconductor wafer). The time it takes to purge the semiconductor processing device with an inactive gas may depend, at least in part, on a volume of the plenum of the dispersion device. For example, dispersion devices with large plenums can increase purge time, e.g., additional time and/or a reduced vacuum pressure may be used to purge the reactant(s) from the surfaces of the dispersion device and the reaction chamber. During a typical ALD process, the reactant pulses, which are in vapor form, can be pulsed sequentially into the reaction chamber with purge steps between reactant pulses to avoid direct interaction between reactants in the vapor phase. For example, inert or inactive gas pulses, or "purge" pulses, can be provided between the pulses of reactants. The inactive gas purges the chamber of one reactant pulse before the next reactant pulse is delivered to avoid gas phase mixing. Increased purge time and/or reduced vacuum pressure may reduce throughput and increase costs during ALD processing. Accordingly, it can be advantageous to decrease the size of the plenum of the dispersion device in order to reduce purge times and improve throughput.

The present disclosure generally relates to vapor distribution systems, to showerhead assemblies of vapor distribution systems, to showerheads of vapor distribution systems, to reactor systems including the vapor distribution systems, and to methods of using the vapor distribution systems, showerhead assemblies, showerheads, and reactor systems. Vapor distribution systems, showerhead assemblies, showerheads, and reactor systems as described herein can be used to process substrates, such as semiconductor wafers, in gas-phase reactors, such as chemical vapor deposition (CVD) reactors, including plasma-enhanced CVD (PECVD) reactors, low-pressure CVD (LPCVD) reactors, atomic layer deposition (ALD) reactors, and the like. By way of examples, the assemblies and components described herein can be used in showerhead-type gas-phase reactor systems, in which gasses generally flow in a downward direction from a showerhead and toward a substrate.

Figure 1:
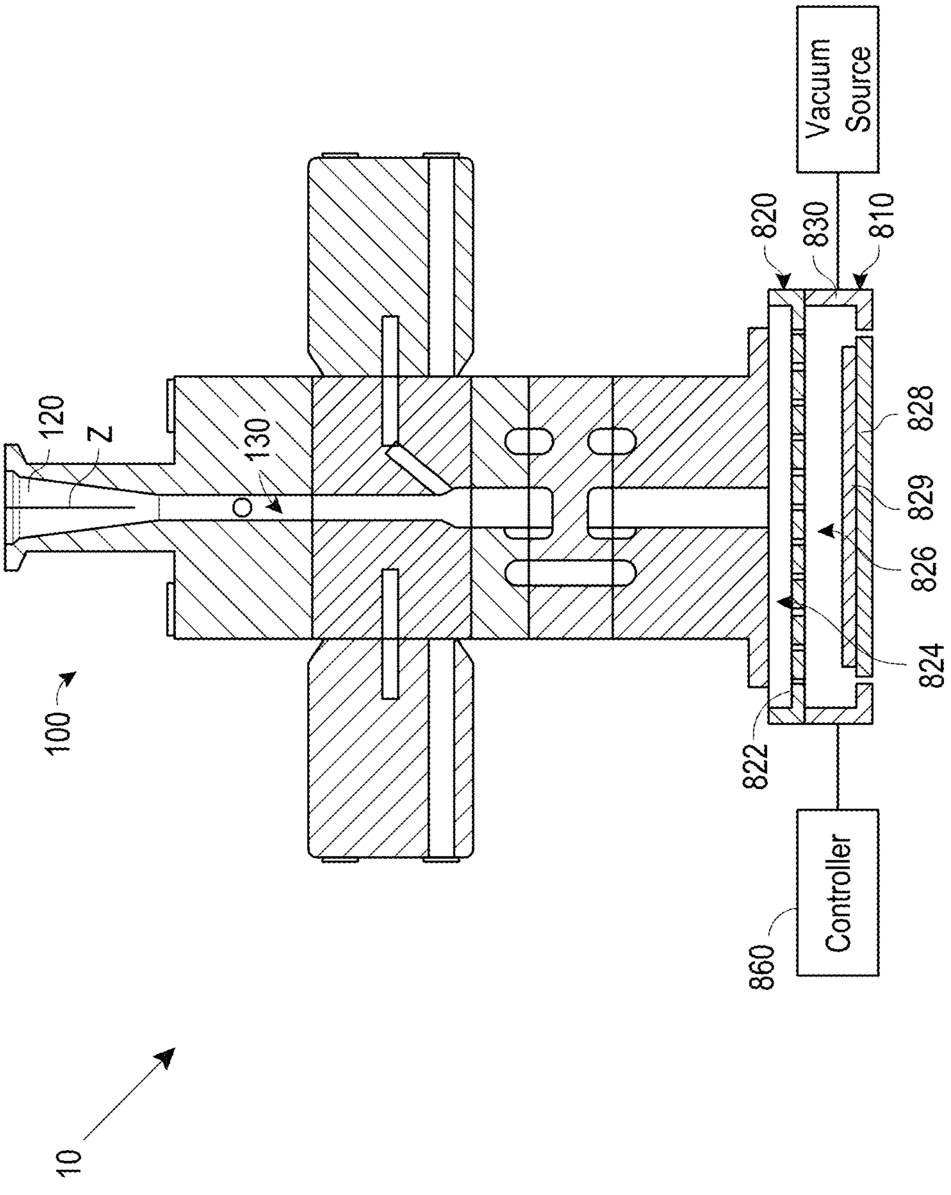
FIG. 1 is a side cross-sectional view of a semiconductor processing device according to various embodiments.

A vapor distribution system can include (but is limited to) the components shown in FIG. 1. FIG. 1 illustrates a semiconductor processing device 10, which is also shown in and described in connection with FIG. 8B of U.S. Patent Publication No. US 2017-0350011, the entire contents of which are incorporated by reference herein in their entirety and for all purposes. FIG. 1 illustrates a manifold 100 which is part of the overall semiconductor processing device 10. The manifold 100 can include a bore 130 that injects vapor downwards towards a dispersion device comprising a showerhead assembly 820. It is understood that the manifold 100 can include multiple blocks connected together, as illustrated, or can comprise one unitary body. The manifold 100 can be connected upstream of a reaction chamber 810. In particular, an outlet of the bore 130 can communicate with a reactant injector, particularly the dispersion mechanism in the form of the showerhead assembly 820. The showerhead assembly 820 includes a showerhead plate 822 that defines a showerhead plenum 824 or chamber above the plate 822. The showerhead assembly 820 communicates vapors from the manifold 100 to a reaction space 826 below the showerhead 820. The reaction chamber 810 includes a substrate support 828 configured to support a substrate 829 (e.g., a semiconductor wafer) in the reaction space 826. The reaction chamber also includes an exhaust opening 830 connected to a vacuum source. While shown with a single-wafer, showerhead type of reaction chamber, the skilled artisan will appreciate that the manifold can also be connected to other types of reaction chambers with other types of injectors, e.g., batch or furnace type, horizontal or cross-flow reactor, etc.

Any suitable number or type of reactants can be supplied to the reaction chamber 810. Various embodiments disclosed herein can be configured to deposit a metal oxide layer(s) onto the substrate. In some embodiments, one or more of the reactant sources can contain a naturally gaseous ALD reactant, such as nitrogen and oxygen precursors such as $H_2$, $NH_3$, $N_2$, $O_2$, or $O_3$. Additionally or alternatively, one or more of the reactant sources can include a vaporizer for vaporizing a reactant which is solid or liquid at room temperature and atmospheric pressure. The vaporizer(s) can be, e.g., liquid bubblers or solid sublimation vessels. Examples of solid or liquid reactants that can be held and vaporized in a vaporizer include various HfO and TiN reactants. For example, solid or liquid reactants that can be held and vaporized can include, without limitation, vaporized metal or semiconductor precursors, such as liquid organometallic precursors such as trimethylaluminum (TMA), TEMAHf, or TEMAZr; liquid semiconductor precursors, such as dichlorosilane (DCS), trichlorosilane (TCS), trisilane, organic silanes, or TiCl4; and powdered precursors, such as $ZrCl_4$ or $HfCl_4$. The skilled artisan will appreciate that embodiments can include any desired combination and arrangement of naturally gaseous, solid or liquid reactant sources.

The semiconductor processing device 10 can also include at least one controller 860, including processor(s) and memory with programming for controlling various components of the device 10. While shown schematically as connected to the reaction chamber 810, the skilled artisan will appreciate that the controller 860 communicates with various components of the reactor, such as vapor control valves, heating systems, gate valves, robot wafer carriers, etc., to carry out deposition processes. In operation, the controller 860 can arrange for a substrate 829 (such as a semiconductor wafer) to be loaded onto the substrate support 828, and for the reaction chamber 810 to be closed, purged and typically pumped down in readiness for deposition processes, particularly atomic layer deposition (ALD). The controller 829 can further be configured to control the sequence of deposition. For example, the controller 829 can send control instructions to reactant valve(s) to cause the reactant valve(s) to open and supply reactant vapor to the manifold 100. The controller 829 can also send control instructions to inactive gas valve(s) to cause the inactive gas valve(s) to open and supply inactive purge gas to the manifold 100. The controller 829 can be configured to control other aspects of the processes as well.

The manifold 100 can inject multiple reactants such as a first reactant vapor and a second reactant vapor, either simultaneously to induce mixing or sequentially to cycle between reactants. During some processes, a purge gas can injected from the bore 130 to the showerhead assembly 820 in order to purge the first reactant vapor so that the first reactant does not contaminate or mix with the subsequently-injected second reactant vapor. Similarly, after the deposition of the second reactant vapor and before deposition of another reactant (e.g., the first reactant vapor or a different reactant vapor), an additional purge step takes place in which inactive gas is delivered downwardly through an inlet 120 to the showerhead assembly 820 and reaction chamber 826.

It is advantageous for the purge time (e.g., an amount of time it takes for inactive gas to purge reactant(s) from the device 10) to be as short as possible in order to increase throughput and reduce costs. The purge time can be related to a size of the reactor chamber 826 size and/or a size of the showerhead assembly 820. Reducing a size of one or both of the showerhead assembly 820 and the reaction chamber 826 can beneficially improve throughput. The showerhead assembly 820 and reactor chamber 826 are described below in the description of FIGS. 2-4.

Figure 2:
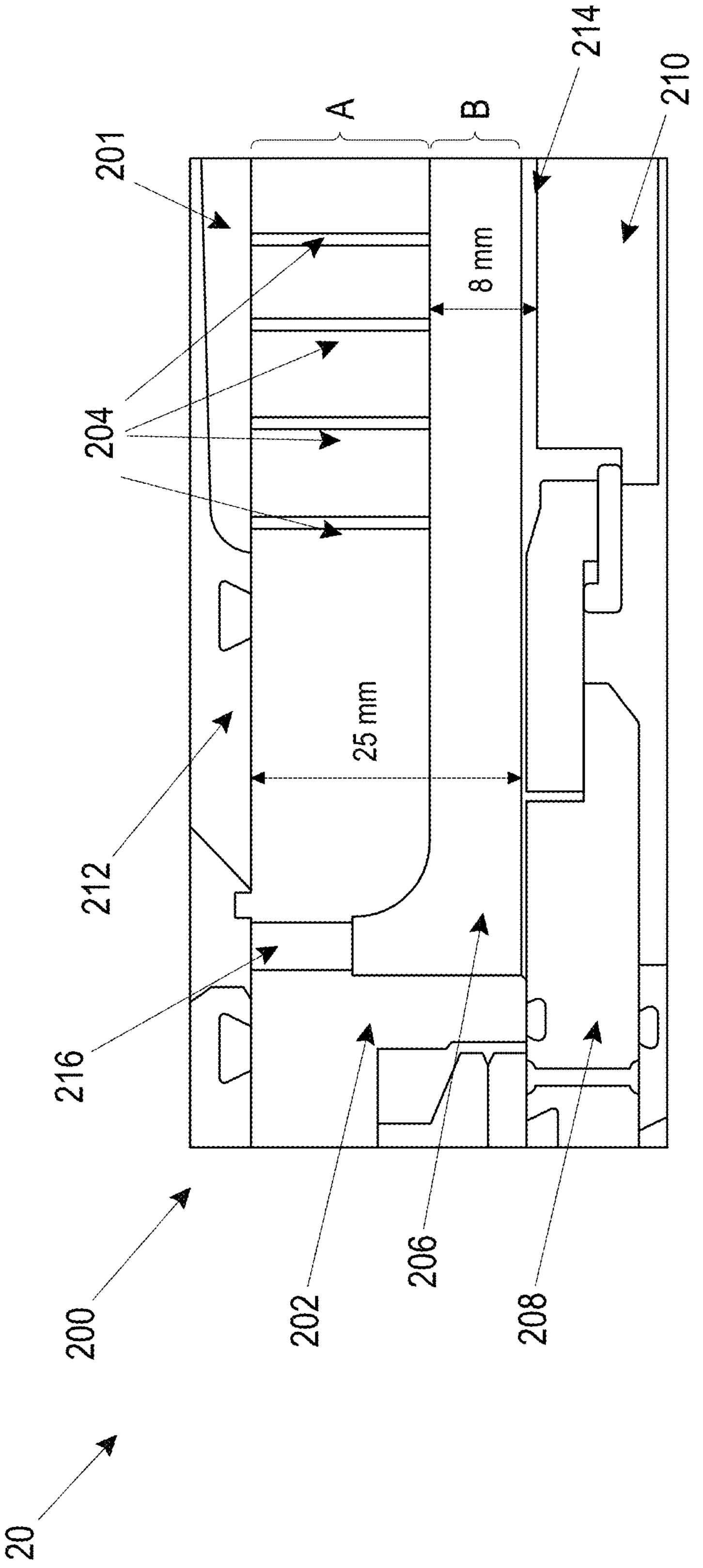
FIG. 2 is a side cross-sectional view of a portion of a showerhead assembly.

FIG. 2 illustrates a cross-sectional view of a portion of a reactor assembly 20 that includes a showerhead assembly 200. The showerhead assembly 200 include a showerhead plate 202 including a plurality of cylindrical apertures 204 formed therein. A top plate 212 can at least partially define a showerhead plenum 201 which can comprise a chamber that collects and laterally dispersed gas delivered to the showerhead assembly 200 from the bore 13. The top plate 212 can include an exhaust opening 216 which can be connected to a vacuum source. The reactor assembly 20 further includes a spacer 208 and a substrate support 210 adapted to support a substrate 214 (such as a semiconductor wafer). A reaction chamber 206 can be formed by the showerhead 202, the spacer 208 and the substrate support 210. Alternatively, there can be other components that surround the substrate 214 to define the reaction chamber 206. The showerhead plate thickness A can be inversely proportional to the chamber height B in that the larger the showerhead thickness A, the smaller the chamber height B. In the illustrated arrangement, the number of apertures 204 formed in the showerhead plate 202 is about 1000. The chamber height B of the reactor assembly 20 is about 8 mm.

Figure 3A:
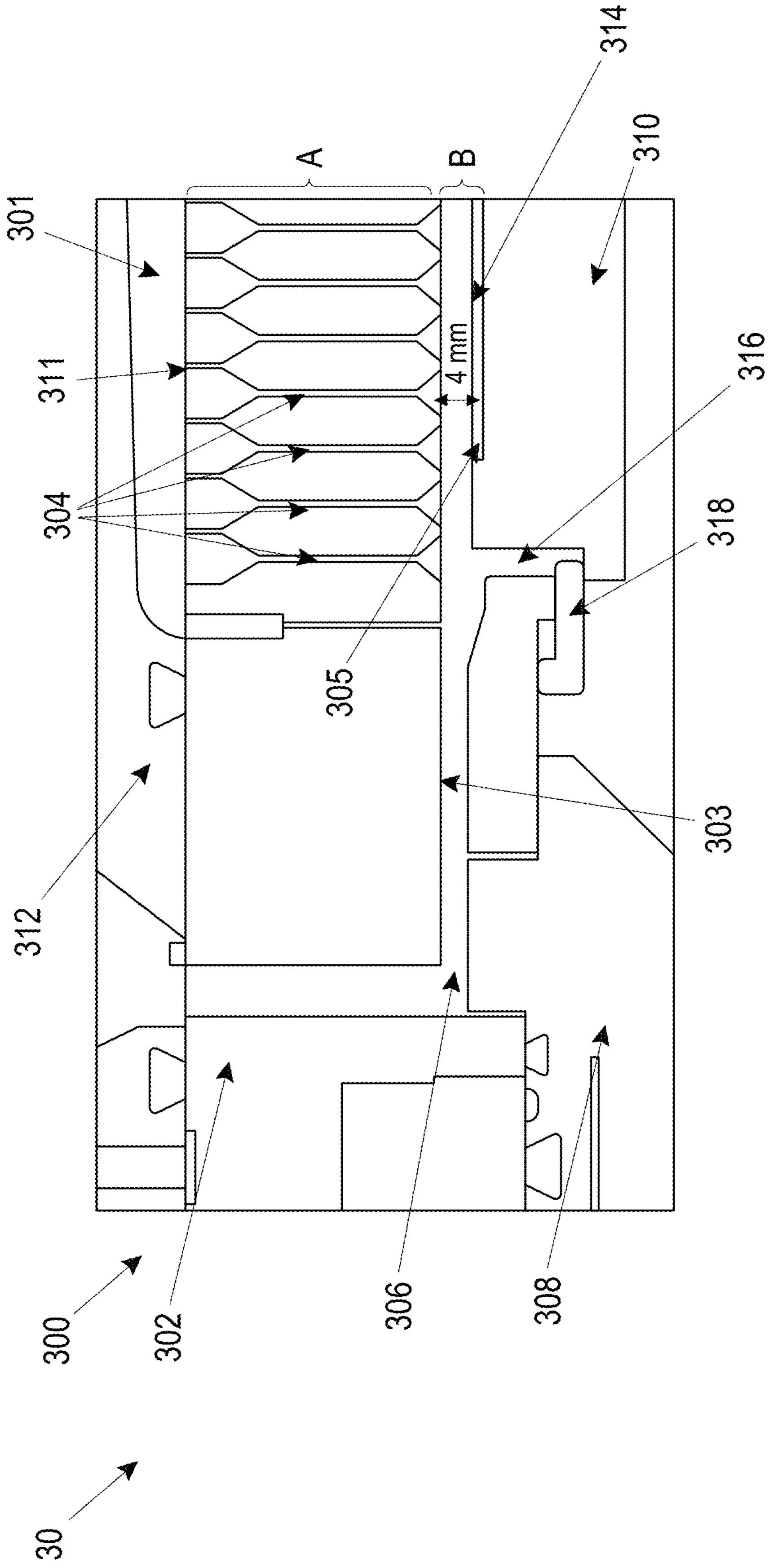
FIG. 3A is a side cross-sectional view of a portion of a showerhead assembly, according to various embodiments.
Figure 3B:
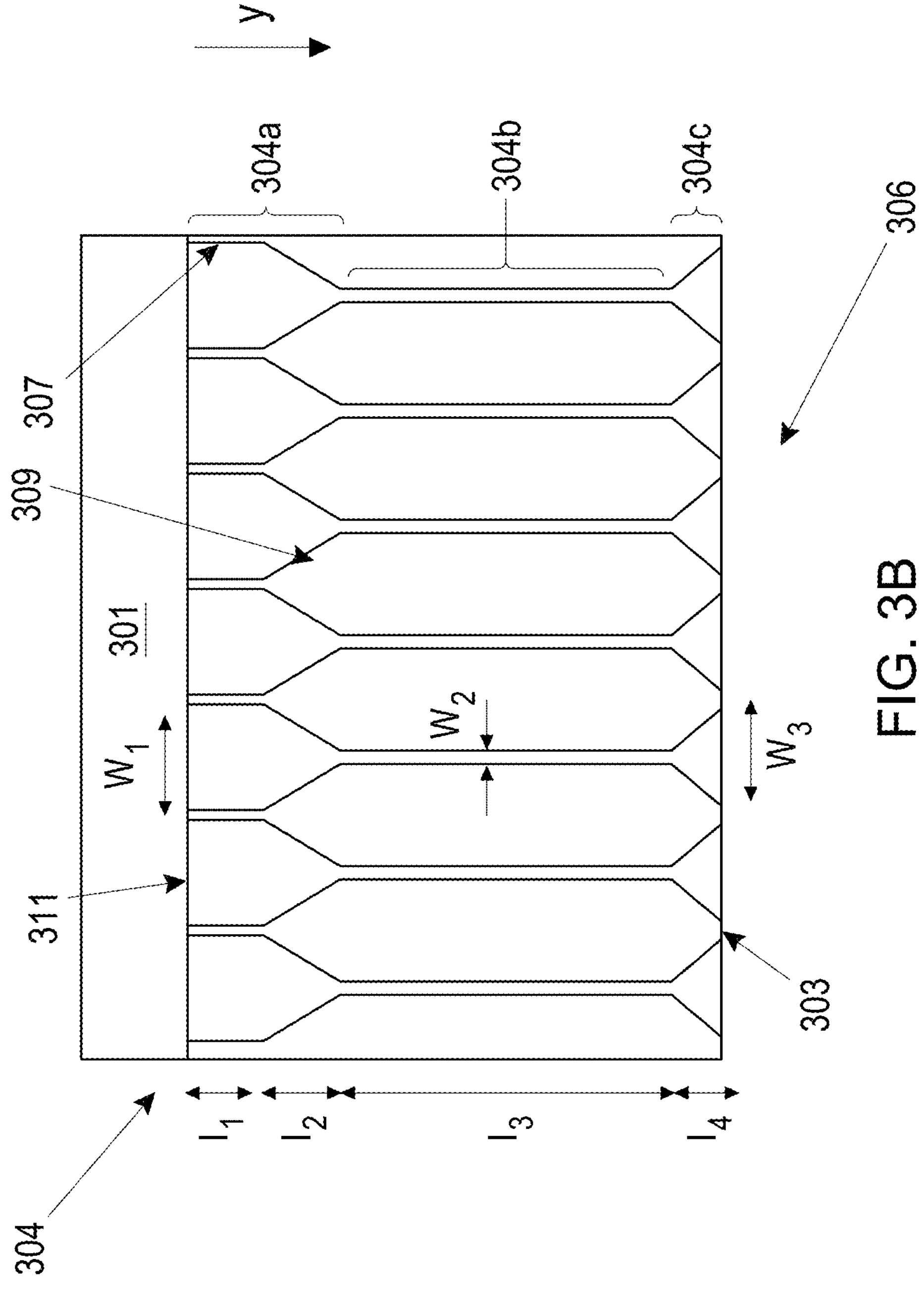
FIG. 3B is an enlarged view of the cross-section shown in FIG. 3A.

FIG. 3A illustrates a cross-sectional view of a portion of a reactor chamber assembly 30 that includes a showerhead assembly 300 according to various embodiments. Similar to the showerhead assembly 200 of FIG. 2, the showerhead assembly 300 includes a showerhead plate 302 including a plurality of apertures 304 formed therein and a top plate 312 which at least partially defines a showerhead plenum 301 to collect and disperse the gas from the bore 130 into the showerhead plate 302. As shown in FIGS. 3A and 3B, the shape of the apertures 304 can be significantly different from the apertures 204 shown in FIG. 2. The shape of the apertures are further shown and described in FIG. 3B. The reactor chamber assembly 30 further includes a substrate support 310 which is configured to support a substrate 314. The reaction chamber 306 can be formed by the showerhead plate 302, a spacer 308 and the substrate support 310. As shown in FIG. 3A, the spacer 308 can serve to mechanically support the showerhead plate 302 and can be mechanically coupled with an end portion of the substrate support 310. A distance from a bottom surface 303 of the showerhead plate 302 to a top support surface 305 of the substrate support 310 can determine the chamber height B and, accordingly, the volume of the reaction chamber 306. A flow control ring 316 and a lower chamber isolation component 318 can be included to isolate the reaction chamber 306 from a lower loading chamber (not shown). The loading chamber can provide access to the substrate support 310 or susceptor. For example, the substrate support 310 can be lowered into the lower loading chamber, and a substrate such as a wafer can be loaded onto the substrate support 310. The substrate support 310 can be raised to expose the substrate to the reaction chamber 306. The control ring 316 and isolation component 318 can accordingly serve to prevent process gases from escaping to the lower loading chamber. In the illustrated embodiment, the isolation component 318 may contact the substrate support 310. The flow control ring 316 can be supported by the spacer 308 and can be connected to or can contact the isolation component 318.

Compared to the showerhead plate 202 of FIG. 2, the thickness A of the showerhead plate 302 of FIG. 3A can be made thicker to decrease the chamber height B and therefore the overall volume of the reaction chamber 306 as compared with the showerhead plate 202 of FIG. 2. A reduced chamber size results in a reduced purge time which as noted above can improve throughput and reduce costs. While there are other ways to decrease chamber size, implementing a showerhead plate 302 with an increased thickness leads to increased customization of chamber size without significantly increasing expense in construction of the chamber, and allows for inexpensive and rapid customization of the effective chamber dimensions by way of replacing the showerhead plate 302. In some embodiments, the chamber height B can be decreased from about 8 mm in the arrangement of FIG. 2 to a chamber height B in a range of about 2 mm to 7 mm, in a range of 2.5 mm to 7 mm, in a range of 2.5 mm to 6.5 mm, in a range of 3 mm to 7 mm, in a range of 3 mm to 6.5 mm, in a range of 3 mm to 6 mm, in a range of 3 mm to 5 mm, or in a range of 3.5 mm to 4.5 mm, for example, about 4 mm in some embodiments. In various embodiments, for example, the thickness A of the showerhead plate 302 can be in a range of about 25 mm to about 35 mm, in a range of about 26 mm to about 34 mm, in a range of about 27 mm to about 33 mm, or in a range of about 29 mm to about 31 mm. In some embodiments, the thickness A of the showerhead plate 302 can be about 27 mm, about 31 mm, or 33 mm. The thickness A of the showerhead plate 302 can comprise a minimum thickness of the plate 302. For example, if the thickness of the showerhead plate 302 varies across its width, then the thickness A described above can comprise the minimum thickness of the plate 302 in portions of the plate that include the apertures 304.

The width of the showerhead plate can depend on the size of substrate which the reactor chamber is adapted to process. In some embodiments, the reactor chamber can be adapted to process a 200 mm substrate and in these embodiments the width of the showerhead plate can be between about 210 mm to about 260 mm or about 210 mm to about 230 mm. In some embodiments, the reactor chamber can be adapted to process a 300 mm substrate and in these embodiments the width of the showerhead plate can be between about 310 mm to about 360 mm or about 310 mm to about 330 mm. In some embodiments, the reactor chamber can be adapted to process a 450 mm substrate and in these embodiments the width of the showerhead plate can be between about 460 mm to about 500 mm or about 460 mm to about 475 mm.

The embodiments disclosed herein can enable the user to customize a reaction chamber to have a desired or predetermined reaction chamber height B. In various embodiments, the showerhead plate 302 can be retrofitted into existing reactor assemblies having an existing showerhead plate. In such embodiments, the existing showerhead plate can be removed, and the showerhead plate 302 can be installed. In some embodiments, the user can select from a plurality of showerhead plates, for example, having different thicknesses. The user can install the selected showerhead plate into an existing reactor, or can design a new reactor to accommodate multiple sizes of showerhead plates.

However, using a reduced chamber height B as shown in FIG. 3B may result in an increase in impingement forces of the incident gas streams on the substrate 314, which can create non-uniformities in deposition. In order to spread out the impingement forces and decrease the impingement forces, the showerhead plate 302 of FIGS. 3A-3B can have an increased number of apertures 304 as compared with the showerhead plate 202 of FIG. 2. For example, the showerhead plate 202 of FIG. 2 includes 1000 apertures 204. In the illustrated embodiment of FIG. 3A, the showerhead plate 302 can include a number of apertures 304 in a range of about 1,500 to 4,500, in a range of 1,500 to 4,000, in a range of 2,000 to 4,500, in a range of 2,000 to 4,000, or in a range of 2,500 to 3,500, for example, about 3,000 apertures 304 in some embodiments. The showerhead plate 302 can include at least 1,200, at least 1,500, or at least 2,000 apertures 304. It would be understood by a skilled artisan that the number of apertures is merely exemplary of a showerhead assembly adapted to a certain substrate size and that alternative substrate sizes would have increased or decreased number of apertures 304.

FIG. 3B illustrates a magnified cross-sectional view of a portion of the showerhead assembly 300 shown in FIG. 3A. The apertures 304 are enlarged to show additional structural details. In FIG. 3B each of the plurality of apertures 304 has an inlet portion 304*a*. The inlet portion 304*a* can have a first axial section 307 at an upper portion of the showerhead plate 302 that is exposed to the showerhead plenum 301, as shown in FIGS. 3A-3B. As shown, the first axial section 307 can comprise vertically straight sidewalls that extend along a vertical axis y of the showerhead plate 302. The vertical axis y can correspond to a direction of gas flow from the showerhead plenum 301, through the showerhead plate 302, and into the reaction chamber 306. The sidewalls of the first axial section 307 can be generally perpendicular to a top surface 311 of the showerhead plate 302 that is exposed to the showerhead plenum 301. The first axial section 307 can beneficially serve as a counterbore to assist in manufacturing the apertures 304 of the thicker showerhead plate 302. As explained below, a shape of the first axial section 307 as seen from a top or bottom view can be polygonal (e.g., hexagonal), although other shapes (e.g., other polygonal shapes, or rounded shapes) may be suitable.

Further, the inlet portion 304*a* can have a second tapered section 309 which transitions from the first axial section 307 to an elongate conduit portion 304*b* that extends along the vertical axis y. The second tapered section 309 can have angled sidewalls that angle inwardly from the first axial section 307 relative to the vertical axis y. For example, as shown in FIG. 3B, a major lateral dimension of the apertures 304 can decrease from the first axial portion 304*a* to the conduit portion 304*b*.

As with the first axial portion 307, the conduit portion 304*b* can have vertically straight sidewalls that extend along the vertical axis y of the showerhead plate 302. The sidewalls of the conduit portion 304*b* can be generally perpendicular to the top surface 311 of the showerhead plate 302. The conduit 304*b* leads to an outlet portion 304*c* which can comprise a tapered section that is exposed to the reactor chamber 306. As shown in FIG. 3B, sidewalls of the outlet portion 304*c* can be angled outwardly relative to the vertical axis y, such that a major lateral dimension of the apertures 304 increases from the conduit portion 304*b* to the bottom surface 303 of the showerhead plate 302. Including a tapered section for the outlet portion 304*c* can reduce gas stagnation points and can facilitate the gas flow in a desired direction. For example, the tapered sections in the inlet portion 304*a* and the outlet portion 304*c* may facilitate gas flow in a direction that is substantially perpendicular to a surface of the substrate 314. The tapered sections in the inlet portion 304*a* and the outlet portion 304*c* can be continuously tapered, such as linearly tapering, or tapered in another profile, e.g., frusto-pyramidal or frusto-conical shape, or include a curvature, such as partial spherical or partial ellipsoid. An angle between the vertical axis y and the sidewalls of the tapered sections 309, 304*c* can be in a range of about 30° to about 90°, in a range of about 60° to about 90°, in a range of about 75° to 90°, or in a range of about 77° to about 85°, for example, about 82° in one embodiment.

To accommodate the increased number of apertures 304 in the showerhead plate 302 of FIGS. 3A-3B, a maximum lateral dimension of the apertures 304 can be reduced. In various embodiments, for example, a first width $w_1$ of the first axial section 307 of the inlet portion 304*a* can be in a range of about 5 mm to about 6 mm, or about 5.66 mm in one embodiment. A second width $w_2$ of the conduit portion 304*b* can be in a range of about 0.5 mm to about 1 mm, or about 0.79 mm in one embodiment. A third width $w_3$ of the outlet portion 304*b* can be in a range of about 5 mm to about 6 mm, or about 5.48 mm in on embodiment. As explained above, moreover, the thickness A of the showerhead plate 302 can be increased. In various embodiments, a first length $l_1$ of the first axial section 307 can be in a range of about 3.5 mm to about 4.5 mm, or about 4 mm in one embodiment. A second length $l_2$ of the second tapered section 309 can be in a range of about 3.5 mm to about 4.5 mm, or about 4 mm in one embodiment. A third length $l_3$ of the conduit portion 304*b* can be in a range of about 15 mm to about 20 mm, or about 17.97 mm in one embodiment. A fourth length $l_4$ of the outlet portion 304*c* can be in a range of about 2.5 mm to about 3.5 mm, or about 3 mm in one embodiment.

It can be challenging to manufacture high aspect ratio apertures 304 in the thick showerhead plate 302 of FIGS. 3A-3B. Beneficially, the use of the straight first axial section 307 can serve as a counterbore to improve manufacturability of the elongate conduit portion 304*b*. Moreover, in some devices, high aspect ratio apertures may be undesirable, e.g., the reactant vapor may break down and/or deposit onto or clog the aperture. The shape of the apertures 304 can include the axial portion and tapered portions, which can assist in mitigating these issues.

Figure 4:
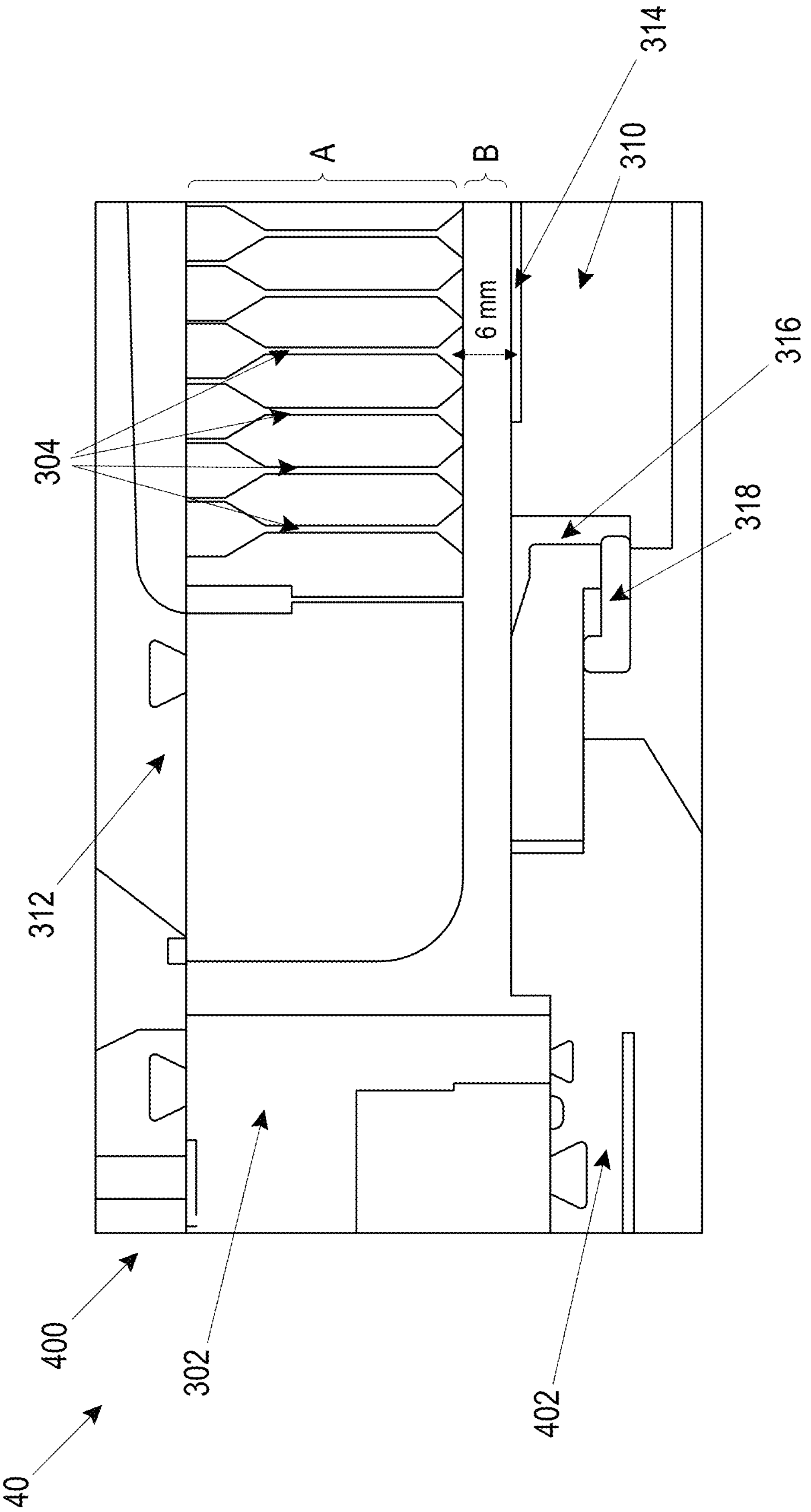
FIG. 4 is a side cross-sectional view of a showerhead assembly, according to another embodiment.

FIG. 4 illustrates a cross-sectional view of a reactor chamber assembly 40 including a showerhead assembly 400. The showerhead assembly 400 includes a showerhead plate 302 that may be the same as or generally similar to the showerhead plate 302 of FIGS. 3A and 3B. The showerhead plate 302 can include a plurality of apertures 304 which have a shape and size described above in FIG. 3B. FIG. 4 also shows the substrate support 310 that is configured to support a substrate 314. However, the spacer 402 of the reactor assembly 40 of FIG. 4 is different than the spacer 308 of FIG. 3A. In FIG. 4, the spacer 402 can serve to set the height between the showerhead plate 302 and the substrate support 310 by spacing the showerhead plate 302 from the substrate support 310 which alters the chamber height B. The showerhead plate 302 has a thickness A. In FIG. 4, the size of the spacer 402 can be modified to position the substrate support 310 closer to the showerhead plate 302, thereby decreasing chamber height B and decreasing chamber volume. By altering the size of the spacer 308, chamber size can be customized based on different parameters for different process recipes. For example, in the illustrated embodiment, the reactor volume can be reduced which can beneficially increase throughput.

In some embodiments, the chamber height can be in a range of 2.5 mm to 15 mm, in a range of 2.5 mm to 14 mm, in a range of 3 mm to 13, mm, in a range of 4 mm to 12 mm, or in a range of 5 mm to 10 mm, e.g., about 8 mm in some embodiments, or about 6 mm in some embodiments. In some embodiments, the reaction chamber volume can be in a range about 1280 $mm^2$ to about 1920 $mm^2$. Further, in some embodiments, the reaction chamber width can be in a range of about 200 mm to about 440 mm. A ratio of reaction chamber height to reaction chamber width can be in a range of about 1:80 to about 1:29. Further, the thickness of the spacer can be in a range of about 20 mm to about 30 mm.

Figure 5B:
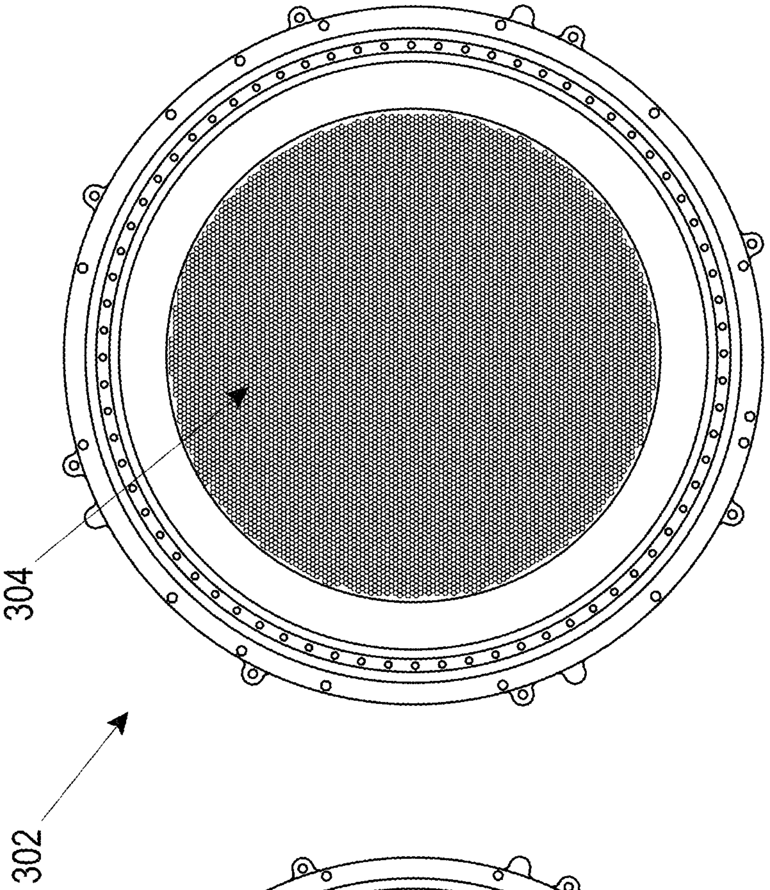
FIG. 5B is a bottom view of the showerhead plate of the showerhead assembly of FIGS. 3A and 3B.
Figure 5A:
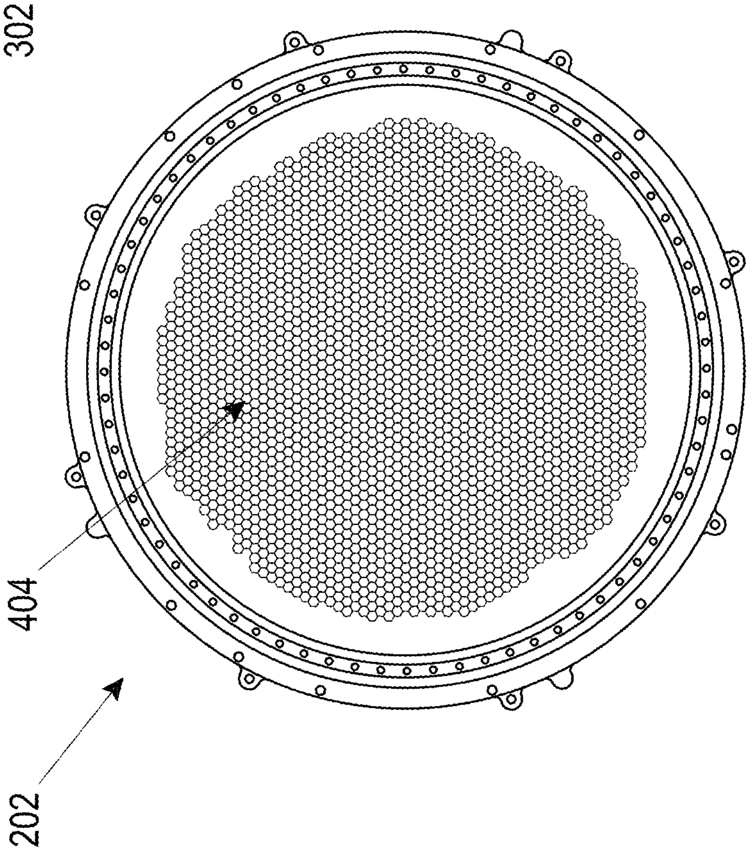
FIG. 5A is a bottom view of the showerhead plate of the showerhead assembly of FIG. 2.

FIGS. 5A and 5B illustrate bottom views comparing showerhead plate 202 of FIG. 2 with the showerhead plate 302 of FIG. 3A, respectively. As described above in FIG. 3A the showerhead plate 302 of FIG. 3A includes a greater number of apertures 304 than the showerhead plate 202 of FIG. 2. As shown in FIGS. 5A and 5B, not only is the number of apertures 304 greater in the showerhead plate 302 of FIG. 3A but the aperture density of FIG. 3A is higher than that of FIG. 2.

For example, as explained above, the number of apertures 304 of the showerhead plate 302 can be 1,500 or greater, or 2,000 or greater, e.g., in a range of 1,500 to 5,000, in a range of 1,500 to 4,000, in a range of 2,000 to 5,000, in a range of 2,000 to 4,000, or in a range of 2,500 to 3,500, for example, about 3,000 apertures 304 in some embodiments. The showerhead plate 302 of FIG. 5B can accordingly have an increased aperture density which decreases the space between apertures as well as the impingement force of gas streams impinging upon the substrate. The reduced space between apertures 304 can reduce impingement forces of gases contacting the substrate. As shown in FIG. 5B, a shape of the apertures 304 as seen from a bottom view (or a top view) can be polygonal, e.g., hexagonal. In other embodiments, however, the shape of the apertures 304 can be different, e.g., circular, elliptical, triangular, rectangular, square, pentagonal, heptagonal, octagonal, etc.

Figure 6B:
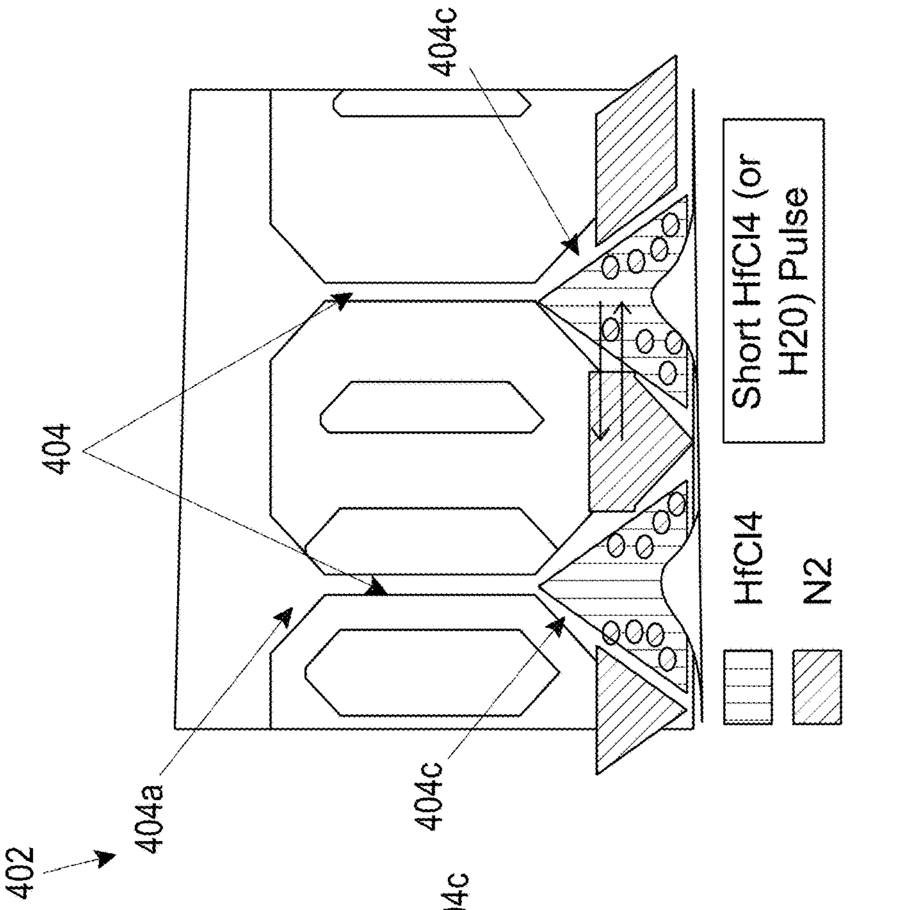
FIG. 6B is a cross-sectional view of the showerhead assembly during a short injection of the first reactant vapor after a previous purge step.
Figure 6A:
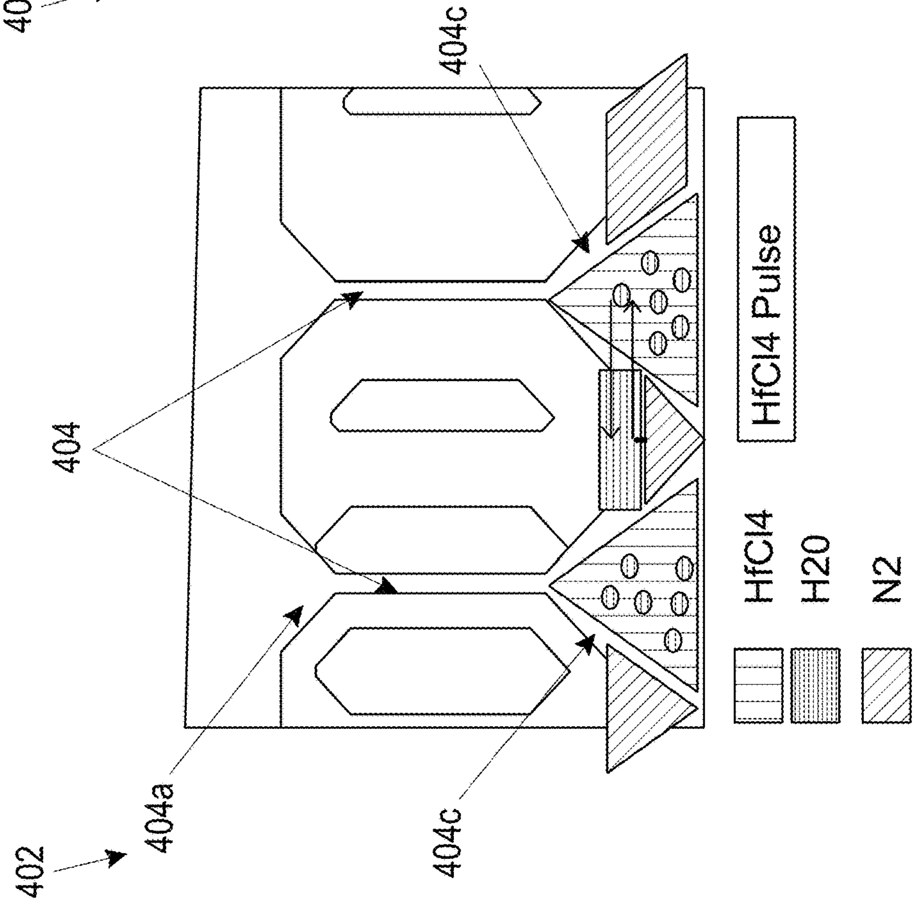
FIG. 6A is a cross-sectional view of a showerhead assembly during injection of vaporized reactant during injection of a first reactant vapor.

FIG. 6A illustrates a cross sectional view of a showerhead plate 402 during injection of a first reactant vapor. FIG. 6A can be utilized with any suitable process recipe, such as deposition of a metal halide material, metal from a solid precursor (at lower vapor pressure), metal chloride precursor, an oxidant, water, metal oxide, $HfO_2$, etc. In the illustrated embodiment, the reactant vapor comprises hafnium tetrachloride ($HfCl_4$). The embodiment of FIG. 6A can be used in a cyclical deposition process. In various embodiments, the plate 402 can be used in ALD processes. The showerhead plate 402 may include a plurality of apertures 404, with each aperture 404 having an inlet tapered portion 404*a*, an elongate conduit portion 404*b*, and an outlet tapered portion 404*c*. The apertures 404 of FIG. 6A may not include an axial portion at the inlet, such as the first axial segment 307 described in connection with FIG. 3B. The first reactant vapor (e.g., $HfCl_4$) is illustrated by the noted portion in FIG. 6A, which exits the outlet portion 404*c* of the aperture 404. However, as FIG. 6A shows, a surface and/or volume between adjacent apertures 404 on the showerhead plate 402 may trap inactive purge gases (such as $N_2$) from a previous purge cycle, or other vapors (such as $H_2O$) from other process steps. The arrows in FIG. 6A illustrate that trapped vapors (such as $H_2O$) can diffuse into the first reactant (e.g., $HfCl_4$) pulsed into the reaction chamber. This diffusion can cause uneven concentrations of the first reactant vapor (e.g., $HfCl_4$) while the diffusion is taking place.

FIG. 6B illustrates a cross sectional view of the showerhead 402 of FIG. 6A during a short injection of the first reactant vapor, such as $HfCl_4$ after a previous purge step. The first reactant vapor (such as $HfCl_4$) is illustrated by the noted portion which is exiting the outlet portion 404*c* of the aperture 404. The inactive purge gas (e.g., $N_2$) is represented by the noted dots and portion. As described in FIG. 6A, during injection of $HfCl_4$, the purge gas may be trapped between the injection apertures 404 and may thereby dilute the surface concentration of the first reactant vapor (e.g., $HfCl_4$). This issue may be especially prevalent with short injections of reactants due to the limited time that the reactants have to diffuse into the areas between the injection apertures 404. By limiting cycle time, short injection times occur and gases trapped between the injection apertures 404 may be problematic.

Figure 7B:
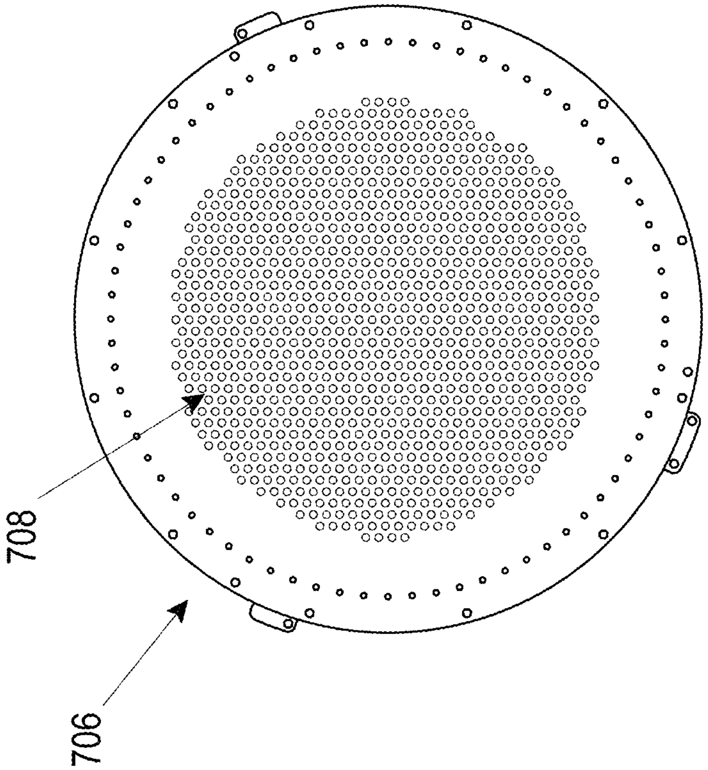
FIG. 7B is a bottom view of a showerhead plate, according to various embodiments.
Figure 7A:
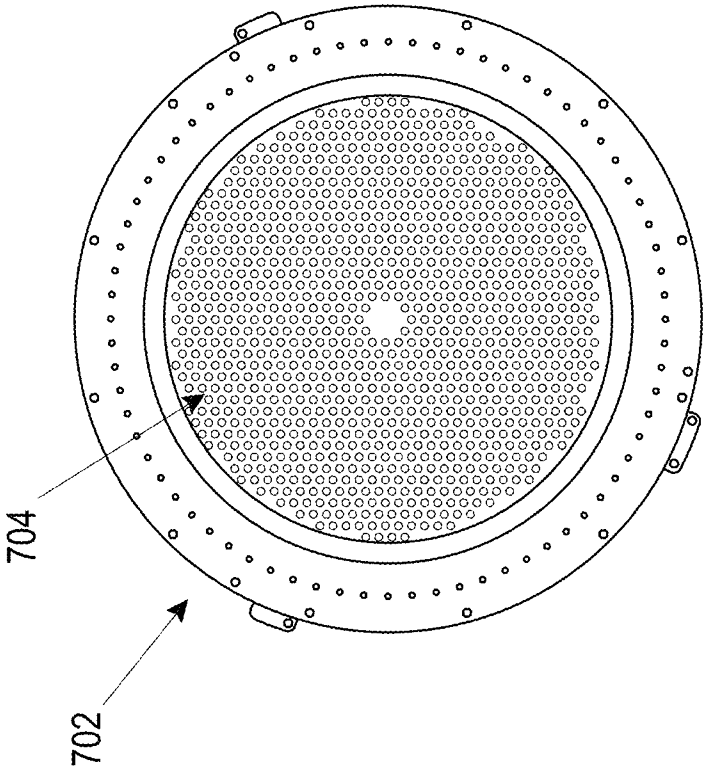
FIG. 7A is a bottom view of a showerhead plate, according to various embodiments.

FIGS. 7A and 7B illustrate schematic bottom views showerhead plates, according to various embodiments. In FIG. 7A, the showerhead plate 702 includes a plurality of apertures 704 formed therethrough. The showerhead plate 702 may include about 1000 apertures 704. By contrast, FIG. 7B illustrates a showerhead plate 706 that may include a greater number of apertures 708 than the plate 702. For example, as explained above, the number of apertures 708 of the showerhead plate 706 can be 1,500 or greater, or 2,000 or greater, e.g., in a range of 1,500 to 5,000, in a range of 1,500 to 4,000, in a range of 1,500 to 2,500, in a range of 2,000 to 5,000, in a range of 2,000 to 4,000, or in a range of 2,500 to 3,500, for example, about 3,000 apertures 304 in some embodiments. The showerhead plate 706 of FIG. 7B can accordingly have an increased aperture density which decreases the space between apertures. By decreasing the space between apertures, the showerhead 706 may have a less amount of gas trapped between the apertures 708, as described in FIGS. 6A and 6B, thereby making injection more uniform, especially during short injection times. As shown in FIG. 7B, a shape of the apertures 708 as viewed from a bottom view (or a top view) can be polygonal, e.g., hexagonal. In other embodiments, however, the shape of the apertures 708 can be different, e.g., circular, elliptical, triangular, rectangular, square, pentagonal, heptagonal, octagonal, etc.

Figure 8A:
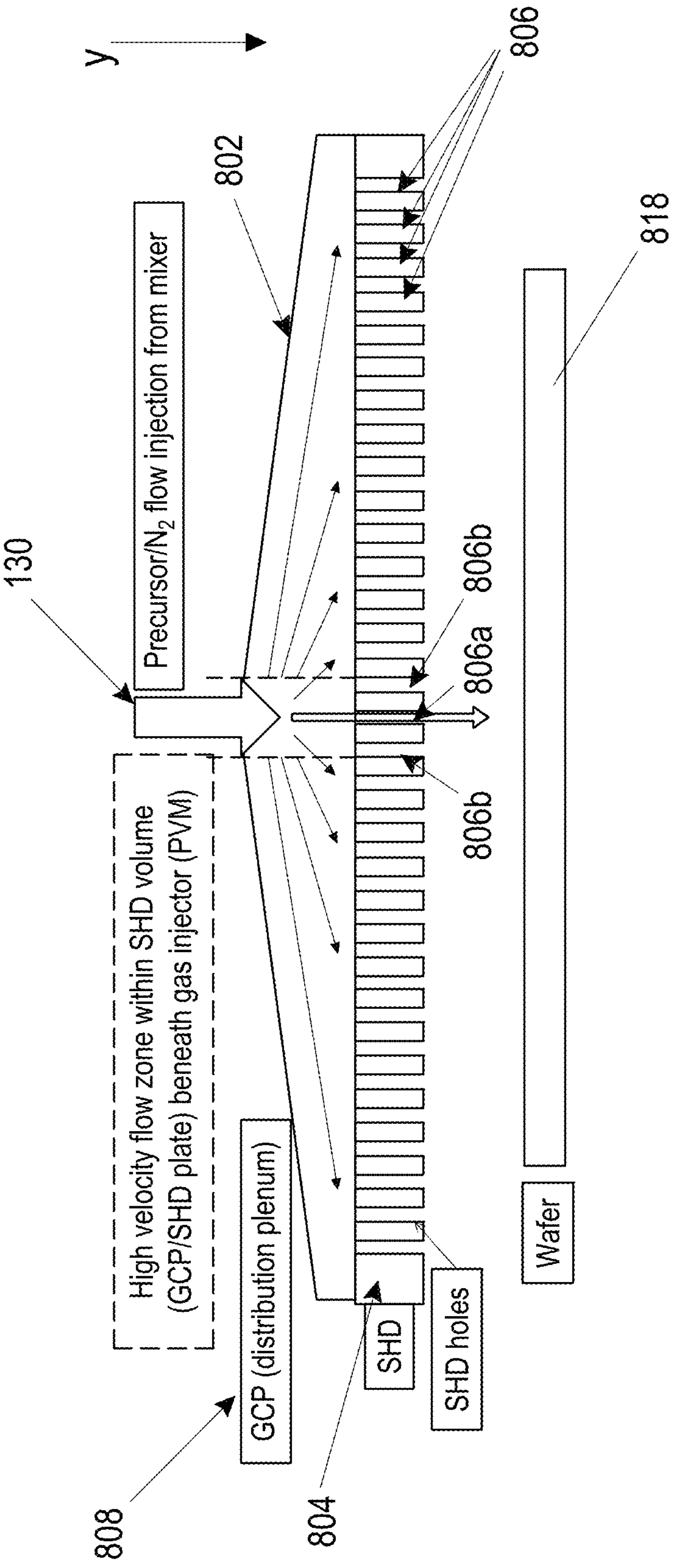
FIG. 8A is a cross-sectional view of a showerhead assembly having a central aperture according to various embodiments.

FIG. 8A illustrate a cross-sectional view of a showerhead assembly 800. The showerhead assembly 800 includes a top plate 802 that defines a showerhead plenum 801 above a showerhead plate 804 with a plurality of apertures 806. The apertures 806 can be vertically straight as shown in FIG. 2 or can have tapered sections as shown in FIGS. 3A and 3B. Further, the showerhead assembly 800 can include other components shown in FIG. 2 or FIG. 3A. As shown in FIG. 1, the vapors enters the showerhead assembly 820 through a bore 130. The bore 130 injects vapors into the showerhead plenum 801 of the showerhead assembly 800, which spreads out the vapors onto the showerhead plate 804. The vapors can pass through the apertures 806 into the reactor chamber. At the center of the showerhead 802 a high velocity flow zone of vapors may result in increased vapor deposition in the middle of a substrate 818, which can create uneven deposition in the middle of the substrate 818. For example, the aperture 806*a* of the plurality of apertures 806 directly in the middle of the showerhead 804 may have the highest velocity of vapors passing therethrough because, for example, the aperture 806*a* may be aligned with the center of the bore 130. The apertures 806*b* of the plurality of apertures 806 next to, or otherwise in the vicinity of, the middle aperture 806*a* may also transmit vapor at high velocities. Thus, showerhead plates 804 having vertical apertures 806*a*, 806*b* in a central region of the showerhead plate 804 that lies directly in the path of vapors delivered from the bore 130 may cause excessive deposition in the central region of the substrate 818.

Figure 8B:
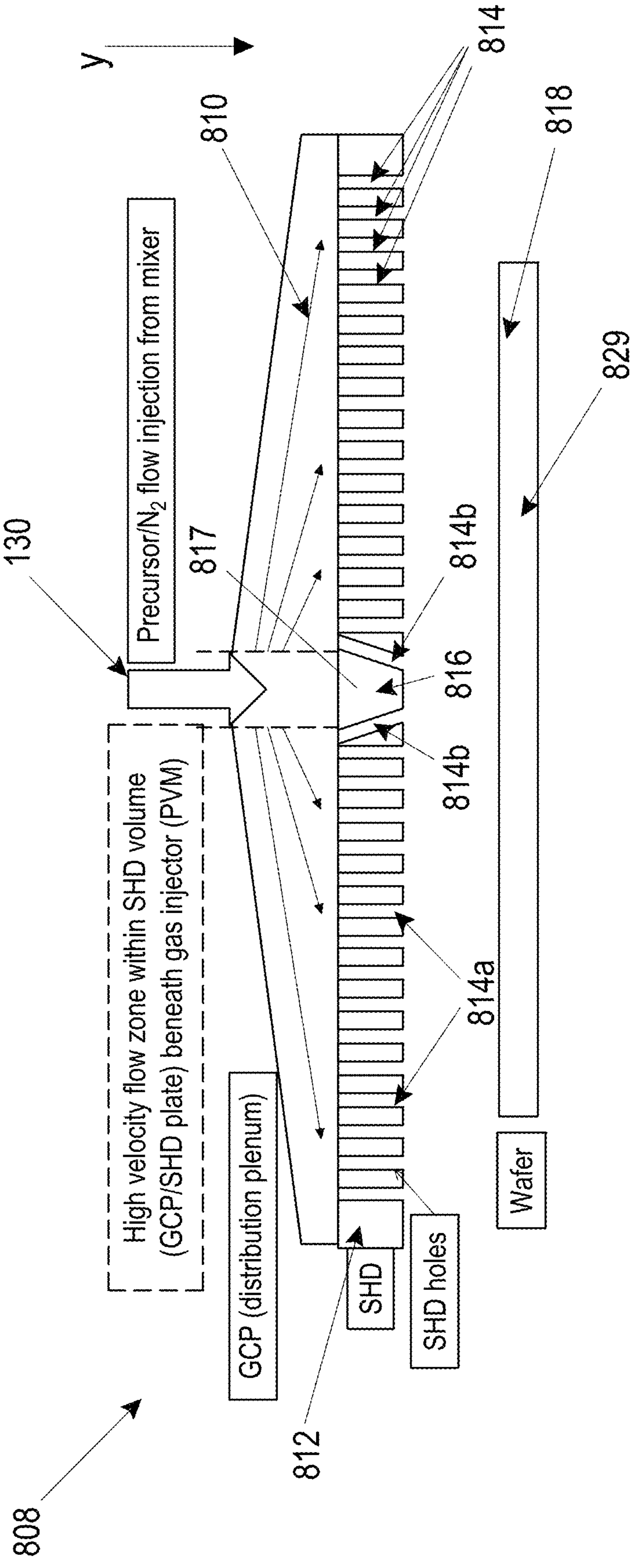
FIG. 8B is a cross-sectional view of a showerhead assembly without a central aperture, according to various embodiments.

FIG. 8B illustrates a cross-sectional view of a showerhead assembly 808, according to various embodiments. The showerhead assembly 808 includes a top plate 810 that defines the showerhead plenum 810 over a showerhead plate 812 with a plurality of apertures 814. Similar to FIG. 8A, the apertures 814 can be vertically straight as shown in FIG. 2 or can have tapered sections as shown in FIGS. 3A and 3B. Further, the showerhead assembly 808 can include other components shown in FIG. 2 or FIG. 3A. As shown in FIG. 1, the vapors enter the showerhead assembly 820 through a bore 130. At the center of the showerhead 812, a high velocity flow zone of vapors may impinge on a central region 816 of the showerhead plate 812. In order to compensate for the high velocity flow zone, the plurality of apertures 814 may not include an aperture at the center position of the showerhead plate 812, such that the maximum velocity component of the vapor flow does not pass through the showerhead plate 812. Rather, a plate body 817 of the showerhead plate 812 can extend along the center position of the showerhead plate 812. Furthermore, as shown in FIG. 8B, the plurality of apertures 814 can include first outer apertures 814*a* and second inner apertures 814*b* disposed near the center of the showerhead plate 812 in the central region 816 of the showerhead plate 812. The first apertures 814*a* can be disposed radially or laterally outside of the second inner apertures 814*b*, and can surround the inner apertures 814*b* in some embodiments. The first apertures 814*a* may comprise vertically straight or axial apertures 814*a* that extend along the vertical axis y of the showerhead plate 812. The first apertures 814*a* may also include tapered portions as shown above in FIGS. 3A-3B.

Furthermore, as shown in FIG. 8B, the inner apertures 814*b* can be angled inwardly so as to direct at least some vapor flow to the central region of the substrate 818. Because the embodiment of FIG. 8B does not include an aperture at the center of the showerhead plate 812, the central region of the substrate 818 may not be deposited with a sufficient amount of reactant. In order to ensure that the central region of the substrate 818 is adequately dosed with reactant, therefore, the angled inner apertures 814*b* can provide flow of vapor to the central region of the substrate 818 at relatively slower velocities. While only the inner apertures 814*b* adjacent or near the central region 816 are illustrated as being angled, more apertures can be angled farther away from the middle 816. The angle of the inner apertures 814*b* can be in a range of 5° to 55°, or in a range of 5° to 25° relative to the vertical axis y.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. A showerhead plate for distributing a vapor to a reaction chamber, the showerhead plate comprising:

a first surface;

a second surface opposite to the first surface; and a plurality of apertures extending from the first surface to the second surface, wherein a thickness of the showerhead plate between the first and second surfaces is in a range of about 25 mm to about 35 mm, wherein at least one aperture of the plurality of apertures comprises:

a first axial inlet section extending from the first surface along a vertical axis of the showerhead plate, the first axial inlet section having a first maximum width;

a conduit portion oriented along the vertical axis of the showerhead plate;

a first tapered section extending from the first axial inlet section, the first tapered section comprising an inwardly-angled sidewall that angles inwardly from the first axial inlet section;

a second tapered section extending from the conduit portion to the second surface, the second tapered section comprising an outlet having a second maximum width;

wherein the conduit portion is longer along the vertical axis than the first axial inlet section, wherein the conduit portion extends from the first tapered section and has a major lateral dimension less than a major lateral dimension of the first axial inlet section, and wherein the first maximum width is greater than the second maximum width.

2. The showerhead plate of claim 1, wherein the second tapered section comprises a sidewall extending linearly and directly from the conduit portion to the outlet having the second maximum width.

3. The showerhead plate of claim 1, wherein the thickness of the showerhead plate between the first and second surfaces is in a range of about 29 mm to about 31 mm.

4. The showerhead plate of claim 1, wherein the reaction chamber is adapted to process a 200 mm diameter substrate, and wherein a width of the showerhead plate is in a range of about 210 mm to about 260 mm.

5. The showerhead plate of claim 1, wherein the reaction chamber is adapted to process a 300 mm diameter substrate, and wherein a width of the showerhead plate is in a range of about 310 mm to about 360 mm.

6. The showerhead plate of claim 1, wherein the reaction chamber is adapted to process a 450 mm diameter substrate, and wherein a width of the showerhead plate is in a range of about 460 mm to about 500 mm.

7. The showerhead plate of claim 4, wherein the plurality of apertures includes a number of apertures greater than 1,200 apertures.

8. The showerhead plate of claim 5, wherein the number of apertures is in a range of about 1,500 to 2,500 apertures.

9. A reactor assembly comprising:

a showerhead assembly comprising a showerhead plenum and the showerhead plate of claim 1, the showerhead plenum disposed over the showerhead plate;

a substrate support adapted to support a substrate; and a reaction chamber defined at least in part by the substrate support and the showerhead plate, wherein a height of the reaction chamber between a top surface of the substrate support to a bottom surface of the showerhead plate is in a range of 3 mm to 7 mm.

10. The reactor assembly of claim 9, further comprising a vaporizer configured to vaporize a solid source precursor.

11. A showerhead plate for distributing a vapor to a reaction chamber, the showerhead plate comprising:

a first surface;

a second surface opposite to the first surface;

a plurality of apertures extending from the first surface to the second surface, wherein multiple apertures of the plurality of apertures comprise:

a first axial inlet section extending from the first surface along a vertical axis of the showerhead plate, wherein the first axial inlet section has a first maximum width at the first surface;

a first tapered section extending from the first axial inlet section, the first tapered section comprising an inwardly-angled sidewall that angles inwardly from the first axial inlet section;

a conduit portion extending from the first tapered section and oriented along the vertical axis of the showerhead plate, the conduit portion having a smaller major lateral dimension than the first axial inlet section; and a second tapered section comprising a linear sidewall extending directly from the conduit portion to the second surface, the second tapered section comprising an outlet configured to deliver the vapor to the reaction chamber, wherein the outlet has a second maximum width at the second surface, wherein the conduit portion is longer along the vertical axis than the first axial inlet section, and wherein the first maximum width is greater than the second maximum width.

12. The showerhead plate of claim 11, wherein a thickness of the showerhead plate between the first and second surfaces is in a range of about 27 mm to about 33 mm.

13. The showerhead plate of claim 11, wherein an angle of opposing sidewalls of the first tapered section is about 82°.

14. The showerhead plate of claim 11, wherein the conduit portion has a length in a range of about 15 mm to about 20 mm.

15. The showerhead plate of claim 11, wherein the first axial inlet section has a vertical height in a range of about 3.5 mm to about 4.5 mm.

16. The showerhead plate of claim 11, wherein the first tapered section has a vertical height in a range of about 3.5 mm to about 4.5 mm.

17. The showerhead plate of claim 11, wherein the second tapered section has a vertical height in a range of about 2.5 mm to about 3.5 mm.

18. The showerhead plate of claim 11, wherein an angle of opposing sidewalls of the first tapered section is in a range of about 60° to about 90°.

19. The showerhead plate of claim 11, wherein an angle of opposing sidewalls of the second tapered section is in a range of about 60° to about 90°.

20. A showerhead plate for distributing a vapor to a reaction chamber, the showerhead plate comprising:

a first surface;

a second surface opposite to the first surface;

a plurality of apertures extending from the first surface to the second surface, the plurality of apertures comprising:

a plurality of outer apertures having aperture portions that extend along a vertical axis of the showerhead plate; and one or more inner apertures, wherein each of the one or more inner apertures comprise a first opening on the first surface, a second opening on the second surface, and an aperture axis from a center of the first opening to a center of the second opening, wherein the aperture axis is angled inwardly towards a central region of the showerhead plate relative to the vertical axis:

wherein at least one aperture of the outer apertures comprises:

a first axial inlet section extending from the first surface along the vertical axis of the showerhead plate;

a first tapered section extending from the first axial inlet section, the first tapered section comprising an inwardly-angled sidewall that angles inwardly from the first axial inlet section;

a conduit portion extending from the first tapered section and oriented along the vertical axis of the showerhead plate, the conduit portion having a smaller major lateral dimension than the first axial inlet section; and a second tapered section comprising a sidewall extending linearly and directly from the conduit portion to the second surface, the second tapered section comprising an outlet configured to deliver the vapor to the reaction chamber, wherein the showerhead plate does not have an aperture at a center position of the showerhead plate.

* * * * *